United States Patent [19]

McDougall

[11] Patent Number: 4,689,591
[45] Date of Patent: Aug. 25, 1987

[54] MAGNET ASSEMBLIES FOR USE IN MAGNETIC RESONANCE IMAGING

[75] Inventor: Ian L. McDougall, Oxford, England

[73] Assignee: Oxford Magnet Technology Limited, London, England

[21] Appl. No.: 814,268

[22] Filed: Dec. 30, 1985

[30] Foreign Application Priority Data

Jan. 4, 1985 [GB] United Kingdom ................ 8500248

[51] Int. Cl.$^4$ .............................................. H01F 5/00
[52] U.S. Cl. .................................... 335/299; 324/319
[58] Field of Search ................ 335/299, 296; 324/318, 324/319, 320, 321

[56] References Cited

U.S. PATENT DOCUMENTS 4,374,360 2/1983 Sepponen ........................ 324/320 X
4,490,675 12/1984 Knuettel et al. .................... 324/318
4,534,358 8/1985 Young ................................ 324/318

Primary Examiner—George Harris
Attorney, Agent, or Firm—Staas & Halsey

[57] ABSTRACT

A magnet assembly, particularly for use in magnetic resonance imaging apparatus, comprises a number of electrical coils (1-6) arranged around and asymmetrically along an axis (8). The relative axial spacing between the coils (1-6) and the fields they generate in use is such that a substantially uniform magnetic field is generated in a homogeneous region (10), the center (11) of the homogeneous region being offset from the geometric center (12) of the assembly.

13 Claims, 6 Drawing Figures

MAGNET ASSEMBLIES FOR USE IN MAGNETIC RESONANCE IMAGING

FIELD OF THE INVENTION

The invention relates to magnet assemblies and methods of operating them particularly for use in magnetic resonance imaging (MRI) apparatus.

DESCRIPTION OF THE PRIOR ART

MR imaging requires that a steady, uniform high strength magnetic field is generated passing through a patient. Gradient magnetic fields are then superposed on this basic field in various complex ways in order to define planes within the patient. In the past, the main magnetic field has been generated by solenoids of superconducting material. With these solenoids, a homogeneous region exists where the magnetic field is substantially uniform throughout the region and it is necessary to place the patient so that the patient's body intersects the homogeneous region. In the past, this homogeneous region has been centred at the geometric centre of the solenoid and this has resulted in partial or complete encapsulation of the patient during an imaging experiment. This is undesirable for the patient and also restricts access to the patient during imaging.

SUMMARY OF THE INVENTION

In accordance with one aspect of the present invention, a magnet assembly comprises a number of magnetic field generators arranged around and along an axis, at least one of the generators being asymmetrically positioned relative to the geometric centre of the assembly, the arrangement of the generators and the magnetic fields they generate in use being such that a substantially uniform magnetic field is generated in a homogeneous region, the centre of the homogeneous region being offset from the geometric centre of the assembly.

We have found that it is possible to offset the homogeneous region by using a magnet assembly of the form defined above. This has particular application in the field of MRI since a patient does not have to be inserted far into a bore of the magnet assembly as has previously been the case. In some cases the patient may not have to be inserted into a bore of the assembly at all. This leads to far greater patient acceptance of the apparatus and simplifies access to the patient for doctors.

The invention is also applicable in other fields such as pipe failure detection where it is necessary to project a homogeneous region of a magnetic field into a pipe wall.

The spacing of the generators from the axis may generally decrease in the axial direction. In other arrangements, the magnetic field generators may be spaced at substantially the same distance from the axis. In addition the direction of the magnetic fields and/or their strengths may be controlled to control the field in the homogenous region.

By "geometric centre" we mean a point on the axis which is equidistant from both ends of the assembly as defined by the magnetic field generators.

By "uniform magnetic field" we include not only a field having substantially the same strength in the homogeneous region but also a field with a controlled gradient in the homogeneous region. Where the field generators comprise coils or turns of electrical conductor it is possible to obtain a gradient field through the homogeneous zone which should, for example, be characterised with a fairly low order term in the expansion of field errors such as the first order. This could have quite important practical uses since it reduces the cost of an MRI scanner incorporating the assembly and if it were a first order gradient, it could set against the pulsing gradients with reference to the MRI scanner. Also, the field profile through the homogeneous zone could be controlled by choosing to select any field gradient term that is needed.

Typically, the assembly will have a circular cross-section although other cross-sections are also feasible.

The magnetic field generators may comprise permanent magnets such as bar magnets with their axes extending in the same general direction as the axis of the assembly and with their north/south directions suitably chosen. Preferably, however, the magnetic field generators comprise coaxial turns of electrical conductor connected in series to form one or more coils and adapted to carry working currents in use. The coils may also be connected in series.

The advantage of using turns of electrical conductor is that the strength of the magnetic field generated by the turns can be varied by varying the current. Hybrid assemblies are also possible involving a combination of permanent magnets and turns of electrical conductor.

The electrical conductor may be superconducting or non-superconducting depending upon the circumstances. In the case of superconducting turns, the assembly needs to be housed in a cryostat in a known manner so as to reduce the temperature of the conductors to a very low level.

Where the turns of electrical conductor form more than one coil, these coils may be supplied with current by separate power supplies or, if they are connected in series, by a common power supply. The advantage of providing separate coils is that the current direction and hence the direction of the magnetic field generated by the coils can be varied from coil to coil.

The magnetic field generators will typically be mounted on a support assembly, usually non-magnetic, and in some cases the support assembly may define a bore coaxial with the axis of the assembly, the homogeneous region being at least partially positioned within the bore.

In accordance with a second aspect of the present invention a method of operating a magnet assembly having a number of coaxial, axially spaced turns of electrical conductor the turns being asymmetically positioned relative to the geometric centre of the assembly, comprises causing electrical current to flow through the turns, the direction and magnitude of the current and the arrangement of the turns being such that a substantially uniform magnetic field is generated in a homogeneous region, the centre of the homogeneous region being offset from the geometric centre of the magnet assembly.

In some cases, currents of different magnitudes may pass through respective groups of the turns connected in series to form the coils but conveniently the number of turns in each coil is predetermined so as to enable the same electrical current to pass through each coil. In order for the magnetic field within the homogeneous region to be useful it is necessary for the current in alternate coils to flow in different directions so that the error terms are balanced.

The simplest way in which to offset the homogeneous region comprises causing one or more turns at the end of the magnet assembly opposite to the end towards which the homogeneous region is offset to generate a larger strength magnetic field than the remaining turns.

A major advantage of this magnet assembly is that standard assembly and production techniques may be employed to fabricate the magnet assembly and the cryostat used to house the magnet assembly when superconducting material is used for the coils. Furthermore, a magnet assembly can be produced that will fit existing MR scanner layouts.

Preferably, where the assembly has a bore, a non-magnetic dividing plate is positioned across the bore of the magnet assembly to define a space containing at least part of the homogeneous region. This is useful since by offsetting the homogeneous region a large part of the bore of the magnet assembly is not required. Thus, in the case of MR imaging apparatus, a patient does not need to see the full extent of the magnet assembly into which he is partially inserted.

BRIEF DESCRIPTION OF THE DRAWINGS

Some examples of magnet assemblies and methods of operating them in accordance with the present invention will now be described and contrasted with prior art assembly with reference to the accompanying drawings, in which.

DETAILED DESCRIPTION OF THE INVENTION

Figure 1:
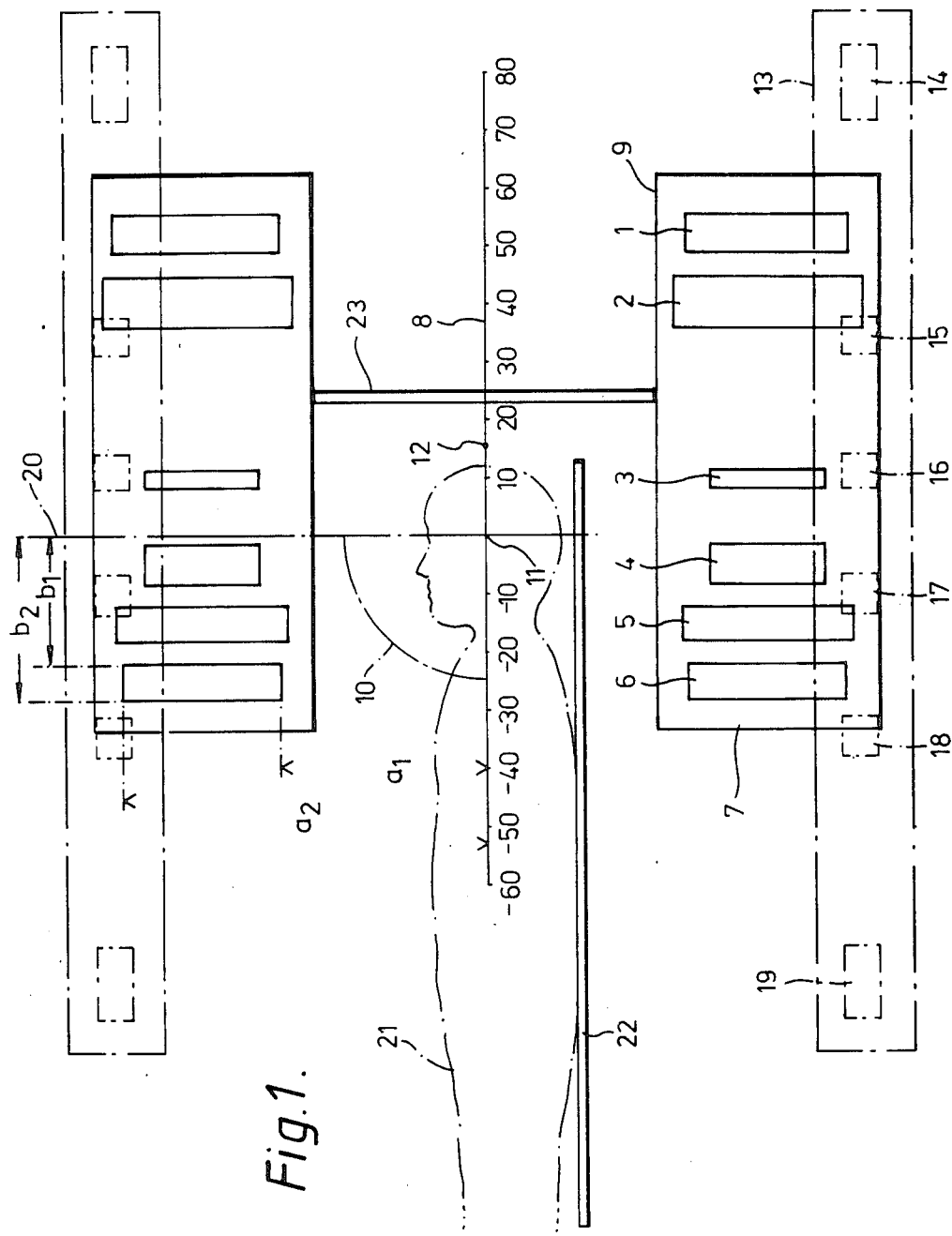
FIG. 1 is a schematic, longitudinal section of one example of the magnet assembly according to the invention with a conventional magnet assembly being shown in phantom for comparison purposes.

The example of a magnet assembly according to the invention shown in FIG. 1 comprises six coils 1-6 comprising respective numbers of series connected turns of superconducting material mounted on a former (not shown) within a conventional cryostat 7. The coils 1-6 are coaxially positioned about an axis 8 and define a bore 9.

In operation, the coils 1-6 of the magnet assembly are supplied with working currents to generate a uniform magnetic field within a homogeneous region 10 having a centre 11 offset along the axis 8 from the geometric centre 12 of the assembly. The table below illustrates the coil configuration, the definitions of $a_1$, $a_2$, $b_1$, $b_2$ being illustrated for the coil 6.

TABLE

| Coil | Turns | $a_1$ (cm) | $a_2$ (cm) | $b_1$ (cm) | $b_2$ (cm) |
|------|-------|-----------|-----------|-----------|-----------|
| 6 | 4088 | 36.4 | 63.6 | 22.0 | 28.0 |
| 5 | −4461 | 35.1 | 64.9 | 12.0 | 18.0 |
| 4 | 3077 | 39.7 | 60.3 | 2.0 | 8.0 |
| 3 | −984 | 40.2 | 59.8 | −19.0 | −21.0 |
| 2 | 6394 | 34.0 | 65.9 | −36.0 | −44.0 |
| 1 | −4650 | 34.5 | 65.5 | −49.0 | −55.0 |

The "−" sign against the number of turns for the coils 1, 3, 5 indicates that current flow through these coils is in an opposite direction to the flow of current in the other coils. If a current of 300 amps is passed through each of the coils then a magnetic field of 1.0T will be generated within the homogeneous region 10 having a peak to peak field error of 20 ppm. The diameter of the homogeneous region 10 is 50 cm.

A further advantage arises from the fact that the assembly has counter-running coils. This causes a reduction in the fringe field against that of a standard long solenoidal magnet. For example, with a standard magnet the fringe field drops to 5 Gauss at 10 m along the axis of the assembly and at 8 m in the radial direction. In contrast to this, with a magnet assembly according to the invention generating a 1.0T field the field drops to 5 Gauss at 5.5 m in the axial direction and 4.0 m in the radial direction.

For comparison purposes, FIG. 1 illustrates a conventional solenoid arrangement labelled 13. This has six coils 14-19 symmetrically positioned about a plane 20 passing through the centre 11 of the homogeneous region 10 at right-angles to the axis 8.

When the assembly is used in MRI apparatus a patient 21 may be positioned as schematically indicated in FIG. 1 and it will be seen that with the magnet assembly comprising coils 1-6 there is far less encapsulation of the patient by comparison with the solenoid 13.

The patient 21 rests on a table 22 of non-magnetic material mounted in any convenient manner in the bore 9 of the assembly. To reduce any worry a patient may have on entering the bore 9, a non-magnetic plate 23 filling the cross-section of the bore 9 is mounted in the bore to screen that part of the bore which is not required for imaging purposes.

Figure 2:
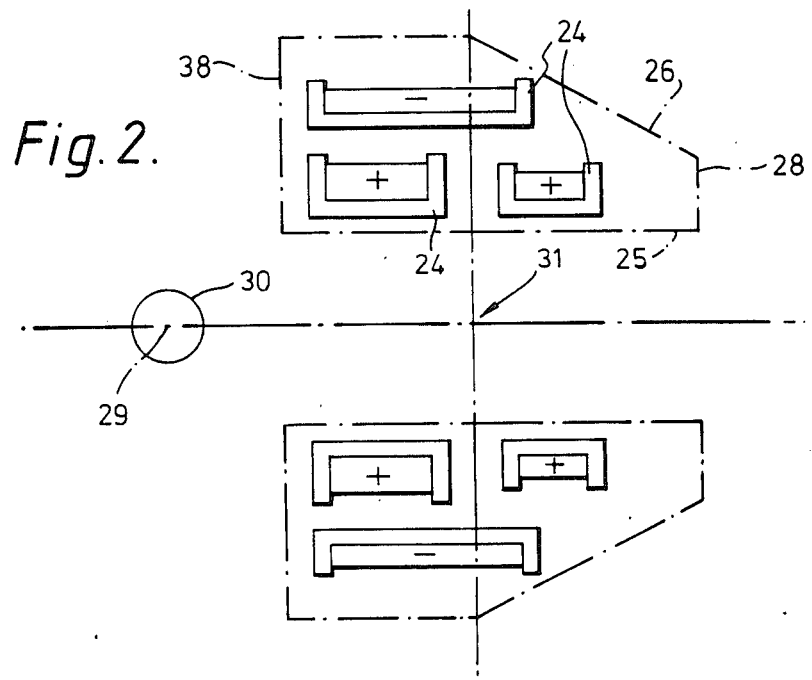
FIGS. 2-5 are schematic, longitudinal sections through four further examples of magnet assemblies accordin to the invention; and, FIG. 6 is a block diagram of MR imaging apparatus incorporating a magnet assembly according to the invention.

FIG. 2 illustrates a modified form of magnet assembly including three formers 24 of non-magnetic material one former radially outward of the other two. The formers 24 define with a cryostat 38 a cylindrical bore 25. The cryostat 38 has a tapered outer surface 26. Respective electrical coils 27 are wound around the formers 24 with the concentration of turns being offset away from an end 28 of the assembly. When a current flows through the coils 27 in the directions indicated in FIG. 2, a substantially uniform magnetic field is generated in a spherical homogeneous region 29 whose centre 30 is offset from the geometric centre 31 of the assembly. The geometric centre only diagrammatically shown and in practice is positioned midway between the axially outermost turns of the two inner coils 24.

For the sake of simplicity, the remaining parts of the magnet assembly and the associated power supply have been omitted for clarity both in FIG. 2 and FIGS. 3 to 5.

Figure 3:
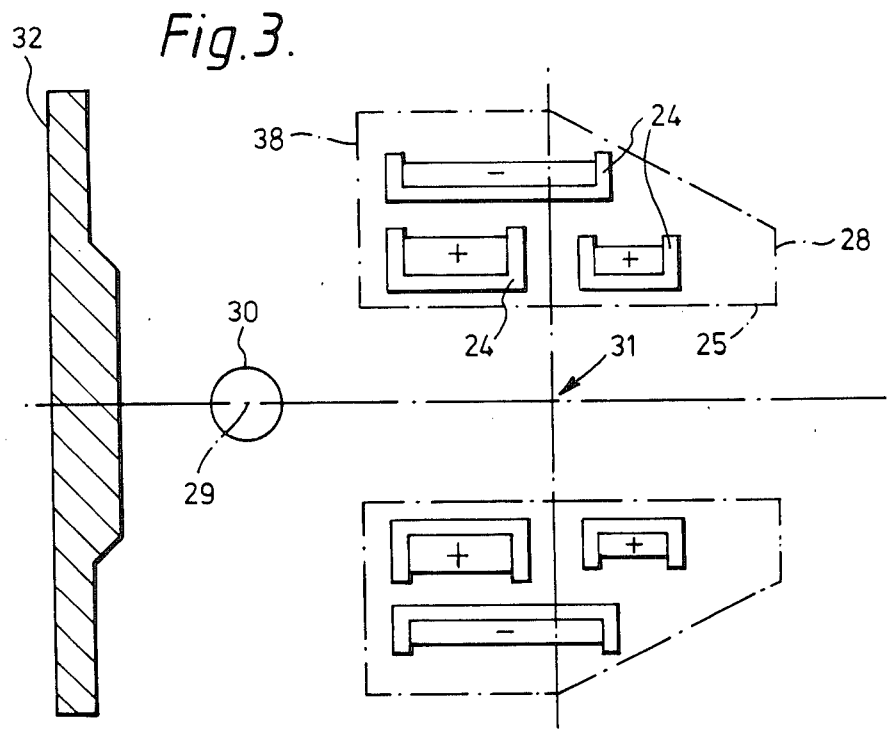

FIG. 3 illustrates an assembly similar to that shown in FIG. 2 with the addition of an iron plate 32 which acts as a magnetic mirror and reduces the number of conducting turns required to produce a given field homogenity in the region 29.

Figure 4:
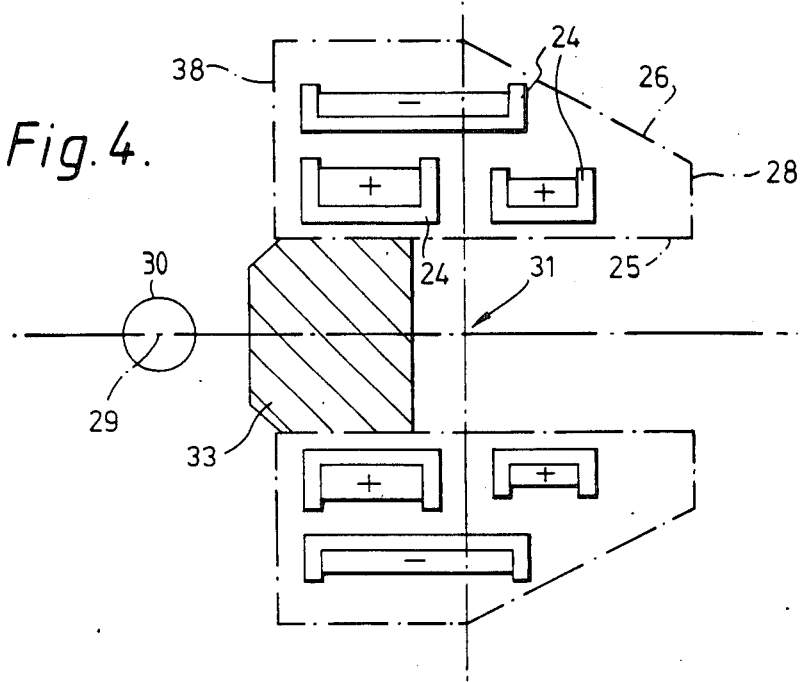

The example shown in FIG. 4 is also similar to that shown in FIG. 2 with the addition of an iron plug 33 in the bore 25 of the former 24. The plug 33 has a similar function to the plate 32.

Figure 5:
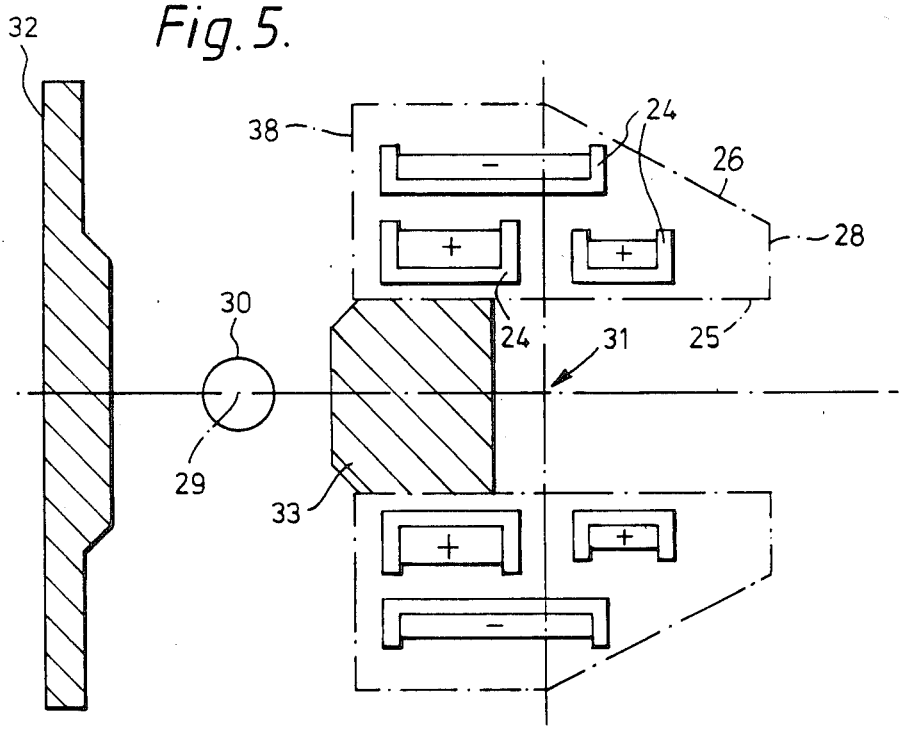

FIG. 5 illustrates an assembly which is effectively a combination of the FIG. 3 and FIG. 4 examples. In this case, both the plate 32 and the plug 33 assist in controlling the homogeneous region 29.

Figure 6:
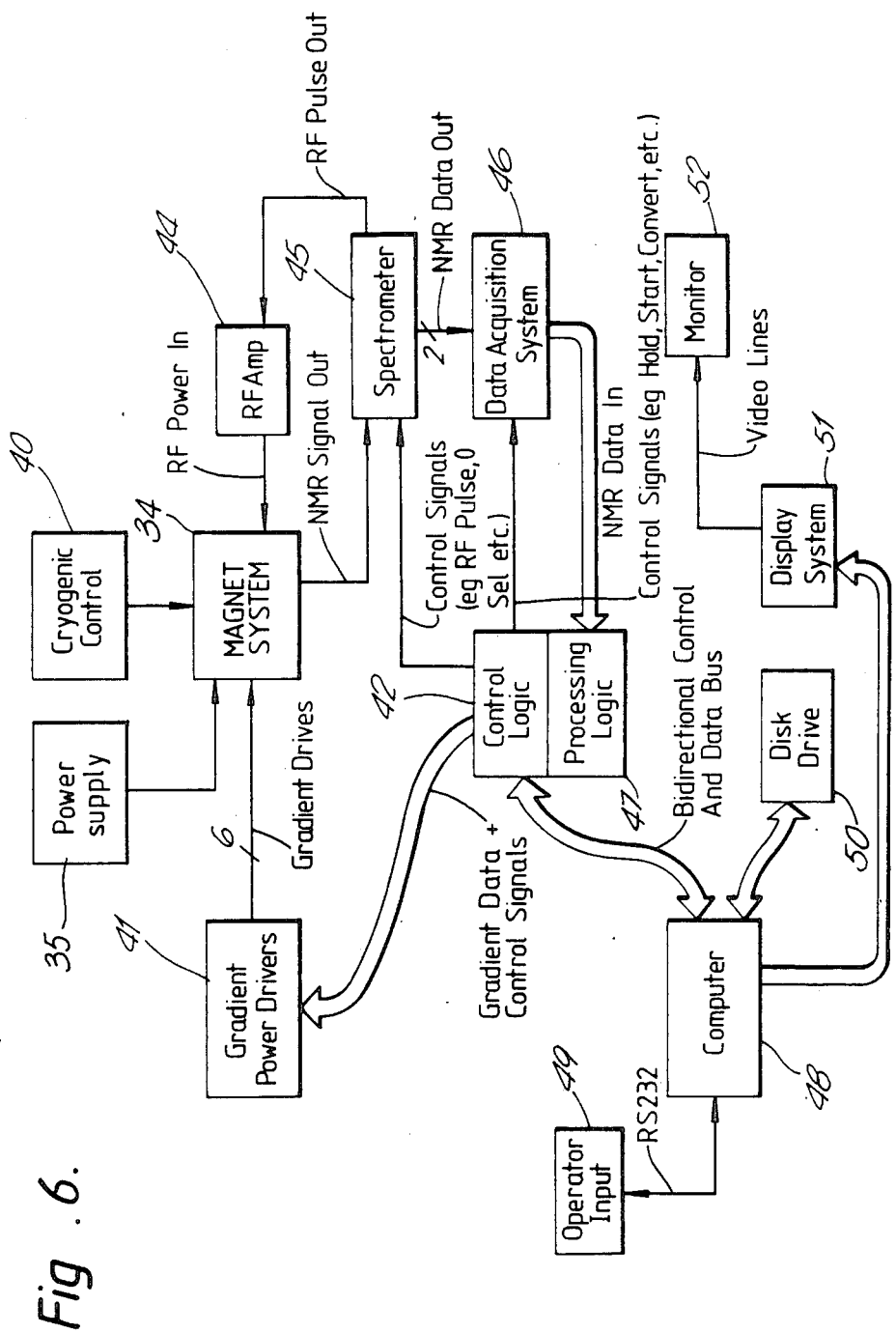

One of the most important applications of the magnet assemblies described is in MR imaging apparatus. FIG. 6 illustrates in block diagram form such apparatus which is otherwise of a conventional form. The apparatus comprises a magnet system 34 which may be as shown in any of FIGS. 1 to 5. The system is housed in a cryostat including a helium can (not shown). The coil or coils of the system are connected either to a common power supply 35 or respective power supplies (not shown). The cryostat is controlled by a cryogenic control system 40 of a conventional type.

The former of the magnet assembly also carries a number of gradient coils (not shown in FIGS. 1 to 5) so that different gradients of magnetic field can be set up in the homogeneous region to enable MR imaging experiments to be carried out. These gradient coils are not superconducting coils and are also of a conventional form. They are driven by respective power drivers 41 controlled from control logic 42 via a waveform generator (not shown). Coils (not shown) for generating and receiving RF energy are also mounted on the former, the RF transmitter being connected to an amplifier 44 which is connected to a spectrometer 45. The RF receiver which detects the MR signal is also connected to the spectrometer 45. The generation of RF pulses is controlled by the control logic 42 which is connected to the spectrometer 45. MR data from the spectrometer 45 passes to a data acquisition system 46 which is controlled by the control logic 42. Data from the system 46 then passes to processing logic logic 47.

The overall control of the system is provided by a computer 48 which is connected via a conventional RS 232 interface to an operator input station 49. Information for the computer is stored in a disc drive 50 while the results of the imaging experiments are passed by the computer to a display system 51 which can display "slices" through the patient's body on a monitor 52.

I claim:

1. A magnet assembly comprising a plurality of magnetic field generators defining an axis, said generators being arranged around and along said axis at least one of said generators being asymmetrically positioned relative to the geometric centre of said assembly, the arrangement of said generators and the magnetic fields they generate in use being such that a substantially uniform magnetic field is generated in a homogeneous region defining a centre, said centre of said homogeneous region being offset from said geometric centre of said assembly.

2. An assembly according to claim 1, wherein the spacing of said generators from said axis generally decreases in the axial direction.

3. An assembly according to claim 1, wherein said magnetic field generators are spaced at substantially the same distance from said axis.

4. An assembly according to claim 1, wherein at least one of said generators is positioned radially outwardly of at least one other of said generators.

5. An assembly according to claim 1, wherein said homogeneous region is centered axially outwardly of said assembly.

6. An assembly according to claim 1, wherein said magnetic field generators each comprise a plurality of turns of electrical conductor connected in series to form a coil adapted to carry a working current in use.

7. An assembly according to claim 1, further comprising a support assembly on which said magnetic field generators are mounted.

8. An assembly according to claim 7, wherein said support assembly defines a bore coaxial with said axis of said assembly, said homogeneous region being at least partially positioned within said bore.

9. An assembly according to claim 7, wherein part of said support assembly comprises a magnetic material.

10. An assembly according to claim 1 positioned adjacent a magnetic mirror with said homogeneous region positioned between said mirror and said assembly.

11. Magnetic resonance imaging apparatus including a magnet assembly according to claim 1; and a patient support to enable part of a patient's body to intersect said homogeneous region.

12. A method of operating a magnet assembly having a plurality of coaxial, axially spaced turns of electrical conductor defining a geometric centre, said turns being asymmetically positioned relative to said geometric centre of the assembly, the method comprising causing electrical current to flow through said turns, the direction and magnitude of said current and the arrangement of said turns being such that a substantially uniform magnetic field is generated in a homogeneous region defining a centre, said centre of said homogeneous region being offset from said geometric centre of said magnet assembly.

13. A method according to claim 12, wherein said assembly defines axially opposed first and second ends, the method comprising causing one or more of said turns at said first end of said magnet assembly opposite to said second end towards which said homogeneous region is offset to generate a larger strength magnetic field than the remaining turns.

* * * * *